United States Patent
Bednar et al.

(10) Patent No.: US 12,146,917 B2
(45) Date of Patent: Nov. 19, 2024

(54) DETERMINATION AND UTILIZATION OF OVER-PREDICTIVE BATTERY STATE OF CHARGE

(71) Applicant: GM GLOBAL TECHNOLOGY OPERATIONS LLC, Detroit, MI (US)

(72) Inventors: Jeffrey A. Bednar, South Lyon, MI (US); Justin Bunnell, Farmington Hills, MI (US); Xavier Camacho Tardi, Pontiac, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 434 days.

(21) Appl. No.: 17/554,496

(22) Filed: Dec. 17, 2021

(65) Prior Publication Data
US 2023/0194615 A1 Jun. 22, 2023

(51) Int. Cl.
*G01R 31/367* (2019.01)
*G01R 31/36* (2020.01)
*G01R 31/3835* (2019.01)

(52) U.S. Cl.
CPC ....... *G01R 31/367* (2019.01); *G01R 31/3648* (2013.01); *G01R 31/3835* (2019.01)

(58) Field of Classification Search
None
See application file for complete search history.

(56) References Cited

U.S. PATENT DOCUMENTS

| | | | | |
|---|---|---|---|---|
| 6,252,377 B1* | 6/2001 | Shibutani | ........... | G01R 31/3842 320/132 |
| 6,453,249 B1* | 9/2002 | Shibutani | ............. | G01R 31/392 320/132 |
| 2010/0318252 A1* | 12/2010 | Izumi | ................. | G01R 31/3832 320/109 |
| 2014/0159737 A1* | 6/2014 | Suzuki | ................. | G01R 31/367 324/429 |
| 2016/0049821 A1* | 2/2016 | Aridome | ............... | H02J 7/0071 320/128 |
| 2018/0037130 A1* | 2/2018 | Ohkawa | ................. | B60W 20/50 |
| 2019/0242948 A1* | 8/2019 | Komatsu | ................... | H02J 7/00 |
| 2019/0257889 A1* | 8/2019 | Park | .................... | G01R 31/3842 |

* cited by examiner

*Primary Examiner* — Brent A. Fairbanks
(74) *Attorney, Agent, or Firm* — Quinn IP Law (57) ABSTRACT

A battery system includes a multi-cell rechargeable energy storage system (RESS) and an electronic controller configured to process RESS cell data. The controller is programmed with a battery cell open circuit voltage (OCV) versus state of charge (SOC) data table used to calculate a peak OCV movement for a representative battery cell at predetermined capacity and maximum discharge/charge rate. The controller is configured to acquire voltage data for one of the cells during active RESS cycling. The controller is also configured to pass the acquired voltage data through a first-order lag filter algorithm to generate an overpredicted OCV for the subject cell. The controller is additionally configured to determine an overpredicted SOC value for the subject cell in the data table using an OCV value from the overpredicted OCV. Furthermore, the controller is configured to regulate the RESS using the determined overpredicted SOC value for the subject cell.

20 Claims, 5 Drawing Sheets

DETERMINATION AND UTILIZATION OF OVER-PREDICTIVE BATTERY STATE OF CHARGE

INTRODUCTION

The present disclosure generally relates to determination of an over-predictive battery state of charge and utilization of thereof for battery diagnostic and remedial actions.

An electrical energy storage or battery system or array may include a plurality of battery cells in relatively close proximity to one another. A plurality of battery cells may be assembled into a battery stack or module, and a plurality of battery modules may be assembled into a battery pack. In large battery packs, an individual pack may also be split into separate battery sub-packs, each including an array of battery modules. Batteries may be broadly classified into primary and secondary batteries.

Primary batteries, also referred to as disposable batteries, are intended to be used until depleted of charge, after which they are simply replaced with new batteries. Secondary batteries, more commonly referred to as rechargeable batteries, employ specific high-energy chemistries permitting such batteries to be repeatedly recharged and reused, therefore offering economic, environmental, and ease-of-use benefits compared to disposable batteries. Rechargeable batteries may be used to power such diverse items as toys, consumer electronics, and rotary electric machines, such as electric motors-generators or traction motors for electric propulsion of motor vehicles. Battery cells may be actively depleted of charge during operation of the powered item or through self-discharge during storage.

In an electric vehicle powertrain employing the above-described rotary electric machine, energy is drawn from the cells of the battery system, i.e., the battery cells are actively discharging, whenever the electric powertrain is functioning in a drive or propulsion mode. Depending on the particular configuration of the electric machine, the battery cells may be recharged via an offboard charging station and/or via onboard regeneration. Cell data, such as individual cell or cell group voltages, charging and discharging electrical currents respectively to and from the battery cells or cell groups, and temperature measurements sampled at various locations within the battery system, is collected and closely monitored over time by a battery control unit. Such cell data is used to determine the battery's state of charge (SOC) and general health.

SOC is generally the level of charge of an electric battery relative to its capacity. The units of SOC are percentage points (0%=empty; 100%=full). An alternative form of the same measure is the depth of discharge (DOD), the inverse of SOC (100%=empty; 0% 32 full). SOC is normally used when discussing the current state of a battery in use, while DOD is most often seen when discussing the lifetime of the battery after repeated use. The battery control unit is typically configured to monitor battery operation and adjust battery control parameters based on the collected cell data and determined parameters, such as its SOC or DOD.

SUMMARY

A battery system includes a multi-cell rechargeable energy storage system (RESS) having a plurality of battery cells and an electronic controller connected to the RESS and configured to process data for the plurality of battery cells. The electronic controller is programmed with a battery cell open circuit voltage (OCV) versus state of charge (SOC) data table. The OCV versus SOC data table is used to calculate a peak OCV movement for a representative battery cell at predetermined or rated capacity and maximum discharge or charge rate. The electronic controller is configured to acquire real-time voltage data for one of the plurality of battery cells during active cycling of the RESS.

The electronic controller is also configured to pass the acquired voltage data through a first-order lag filter algorithm. The first-order lag filter algorithm is configured to generate an overpredicted OCV for the one of the plurality of battery cells, such that the overpredicted OCV is calibrated to advance slower in discharge and advance faster in charge than the calculated peak OCV movement by a predetermined margin. The electronic controller is additionally configured to determine, e.g., look up, an overpredicted SOC value for the one of the plurality of battery cells in the OCV versus SOC data table using an OCV value from the overpredicted OCV, wherein the overpredicted SOC value exceeds a true SOC for the subject battery cell by the predetermined margin. Furthermore, the electronic controller is configured to regulate the RESS using the determined overpredicted SOC value for the one of the plurality of battery cells.

The predetermined margin may be controlled to not exceed 5% error of the overpredicted SOC relative to the true SOC.

The first-order lag filter algorithm may include a first filter gain coefficient calibrated to generate the overpredicted OCV for the one of the plurality of battery cells using the acquired voltage data for the one of the plurality of battery cells during active cycling of the RESS.

The electronic controller may be configured to acquire temperature data for the one of the plurality of battery cells. The first-order lag filter algorithm may include a second calibrated filter gain coefficient determined as a function of the acquired temperature and voltage data for the one of the plurality of battery cells acquired by the controller.

The electronic controller may be configured to regulate the RESS via controlling flow and/or temperature of a coolant through the RESS to remove thermal energy from the one of the plurality of battery cells when the overpredicted SOC value is within a predetermined margin.

The electronic controller may be configured to regulate the RESS via controlling a speed of a cooling fan to remove thermal energy from the one of the plurality of battery cells when the overpredicted SOC value is within a predetermined margin.

The electronic controller may be configured to regulate the RESS via controlling a rate of charge and/or discharge of the plurality of battery cells when the overpredicted SOC value is within a predetermined margin.

Controlling the rate of charge and/or discharge of the plurality of battery cells may include limiting power output of a traction motor operatively connected to the RESS or limiting charge current of an onboard charging station or an offboard charging station used for a plug-in charge.

A method of regulating a multi-cell rechargeable energy storage system (RESS) having a plurality of battery cells, as described above, and a motor vehicle employing a traction motor and the RESS connected to an electronic controller are also disclosed.

The above features and advantages, and other features and advantages of the present disclosure, will be readily apparent from the following detailed description of the embodiment(s) and best mode(s) for carrying out the described disclosure when taken in connection with the accompanying drawings and appended claims.

DETAILED DESCRIPTION

Figure 1:
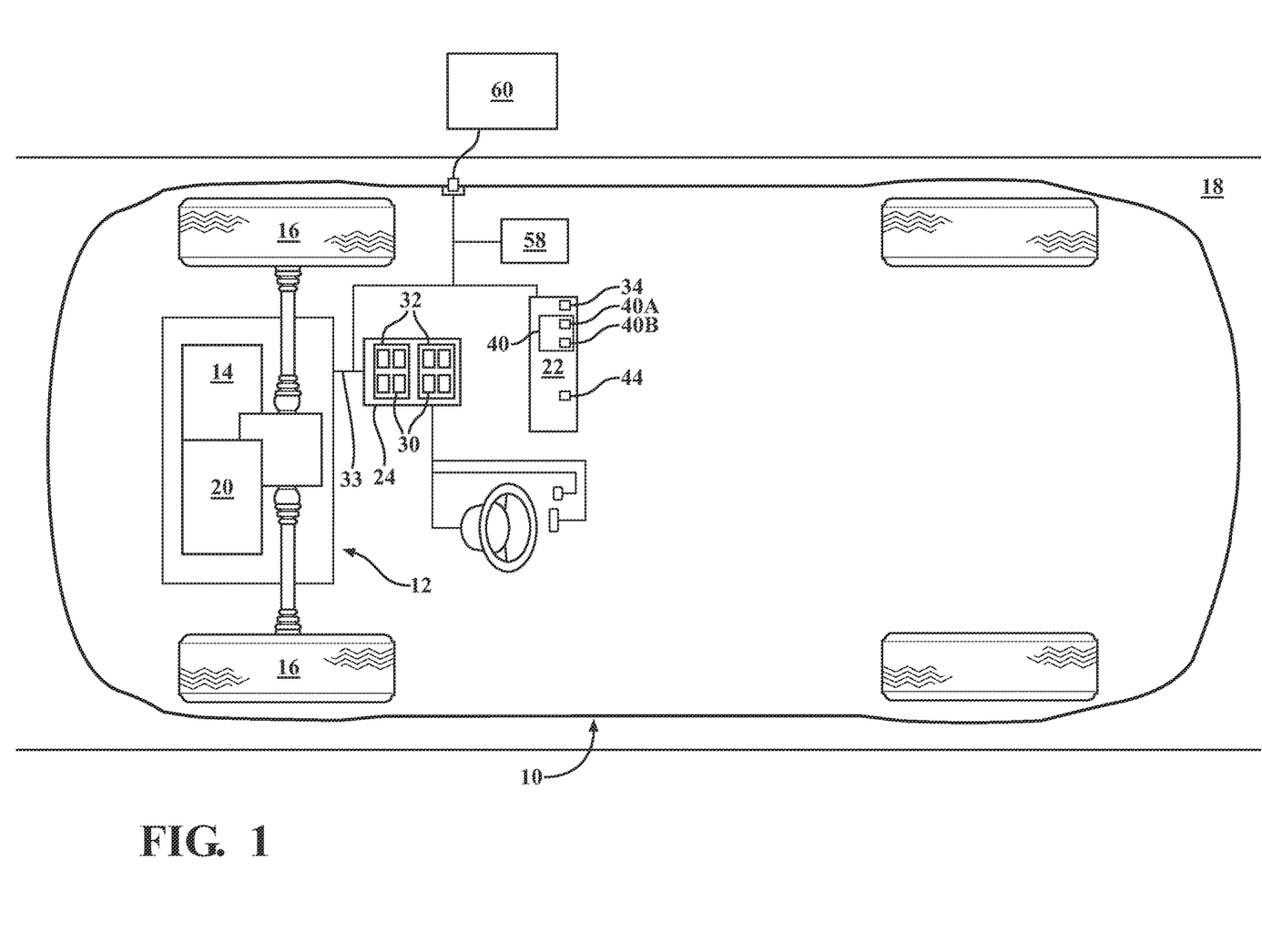
FIG. 1 is a schematic top view of an embodiment of a motor vehicle employing a powertrain with multiple power-sources and a multi-cell rechargeable energy storage system (RESS) configured to generate and store electrical energy for supplying the electrical energy to the power-sources, according to the disclosure.

Referring to FIG. 1, a motor vehicle 10 having a powertrain 12 is depicted. The vehicle 10 may include, but not be limited to, a commercial vehicle, industrial vehicle, passenger vehicle, aircraft, watercraft, train, or the like. It is also contemplated that the vehicle 10 may be a mobile platform, such as an airplane, all-terrain vehicle (ATV), boat, personal movement apparatus, robot, and the like to accomplish the purposes of this disclosure. The powertrain 12 includes a power-source 14 configured to generate a power-source torque T (shown in FIG. 1) for propulsion of the vehicle 10 via driven wheels 16 relative to a road surface 18. The power-source 14 is depicted as an electric traction motor-generator. As shown in FIG. 1, the powertrain 12 may also include an additional power-source 20, such as an internal combustion engine. The power-sources 14 and 20 may act in concert to power the vehicle 10.

Figure 2:
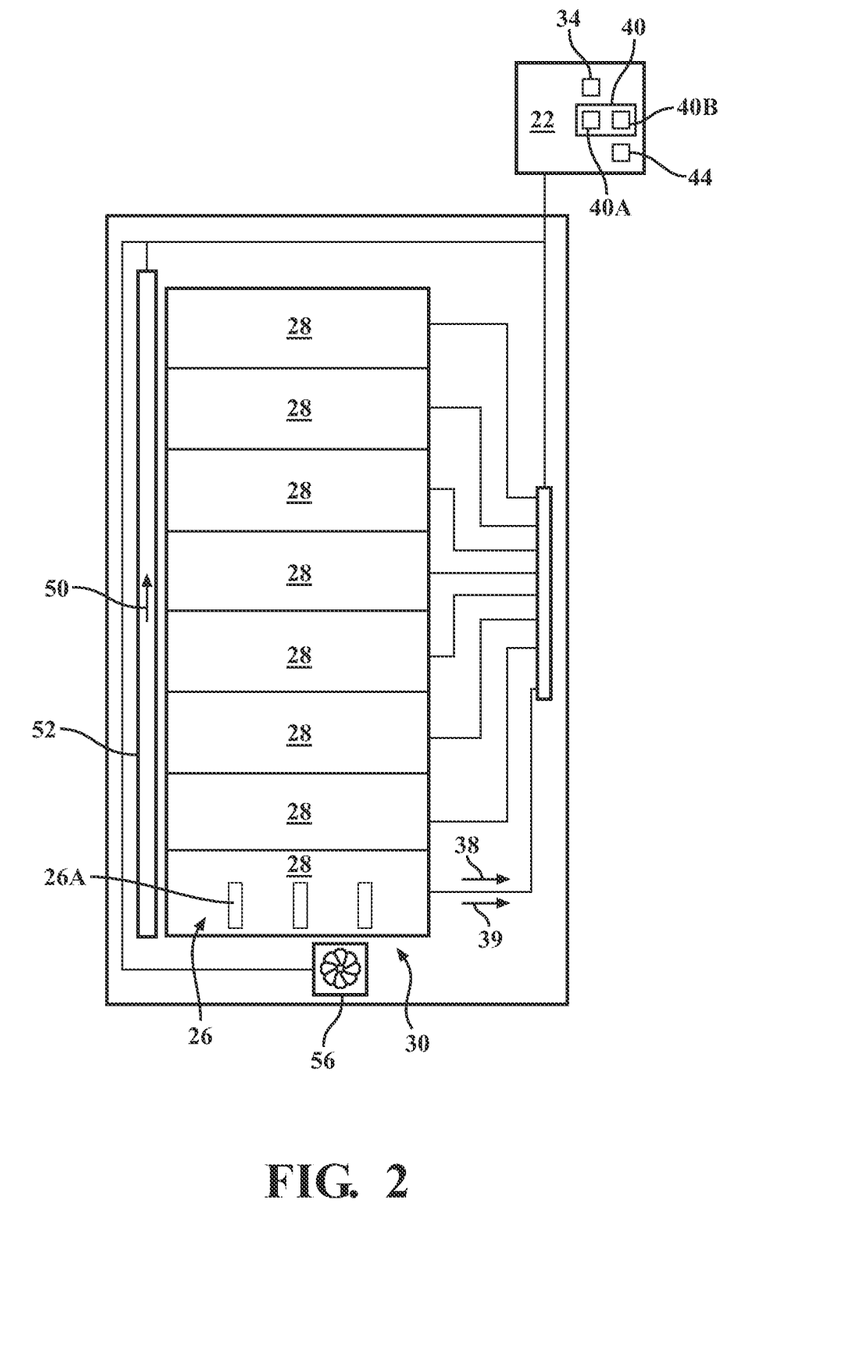
FIG. 2 is a circuit diagram of the RESS battery cells connected to an electronic controller configured to regulate operation of the RESS, according to the disclosure.

The vehicle 10 additionally includes a programmable electronic controller 22 and a multi-cell rechargeable energy storage system (RESS) 24. A general structure of the RESS 24 is schematically shown in FIG. 2. As shown, a plurality of battery cells 26 may be initially combined into cell groups 28, where the individual cells may be arranged in parallel. The cell groups 28 may be subsequently organized into battery modules 30, where the individual cell groups are arranged, i.e., connected, in series. A single module 30 is shown in FIG. 2, but the RESS 24 may have as many such modules as desired. A plurality of modules 30 may then arranged in individual battery sub-packs (not shown). Operation of the powertrain 12 and the RESS 24 may be generally regulated by the electronic controller 22. The RESS 24 may be operatively connected to the power-sources 14 and 20, the electronic controller 22, as well as other vehicle systems via a high-voltage BUS 33 (shown in FIG. 1).

The RESS 24 is configured to generate and store electrical energy through heat-producing electro-chemical reactions, and in the vehicle 10 may be used to supply the electrical energy by being electrically connected to the power-sources 14 and 20. The electronic controller 22 may be programmed to control the powertrain 12 and the RESS 24 to generate a predetermined amount of power-source torque T, and various other vehicle systems. The electronic controller 22 may include a central processing unit (CPU) that regulates various functions on the vehicle 10, or be configured as a powertrain control module (PCM) configured to control the powertrain 12. In either of the above configurations, the electronic controller 22 includes a processor and tangible, non-transitory memory, which includes instructions for operation of the powertrain 12 and the battery system 24 programmed therein. The memory may be an appropriate recordable medium that participates in providing computer-readable data or process instructions. Such a recordable medium may take many forms, including but not limited to non-volatile media and volatile media.

Non-volatile media for the electronic controller 22 may include, for example, optical or magnetic disks and other persistent memory. Volatile media may include, for example, dynamic random-access memory (DRAM), which may constitute a main memory. Such instructions may be transmitted by one or more transmission medium, including coaxial cables, copper wire and fiber optics, including the wires that comprise a system bus coupled to a processor of a computer, or via a wireless connection. Memory of the electronic controller 22 may also include a flexible disk, hard disk, magnetic tape, another magnetic medium, a CD-ROM, DVD, another optical medium, etc. The electronic controller 22 may be configured or equipped with other required computer hardware, such as a high-speed clock, requisite Analog-to-Digital (A/D) and/or Digital-to-Analog (D/A) circuitry, input/output circuitry and devices (I/O), as well as appropriate signal conditioning and/or buffer circuitry. Algorithms required by the electronic controller 22 or accessible thereby may be stored in the memory and automatically executed to provide the required functionality of the powertrain 12 and the RESS 24. The electronic controller 22 is also configured to monitor the RESS 24 and process data, such as via the subject algorithms, for the plurality of battery cells 26.

Figure 3A:
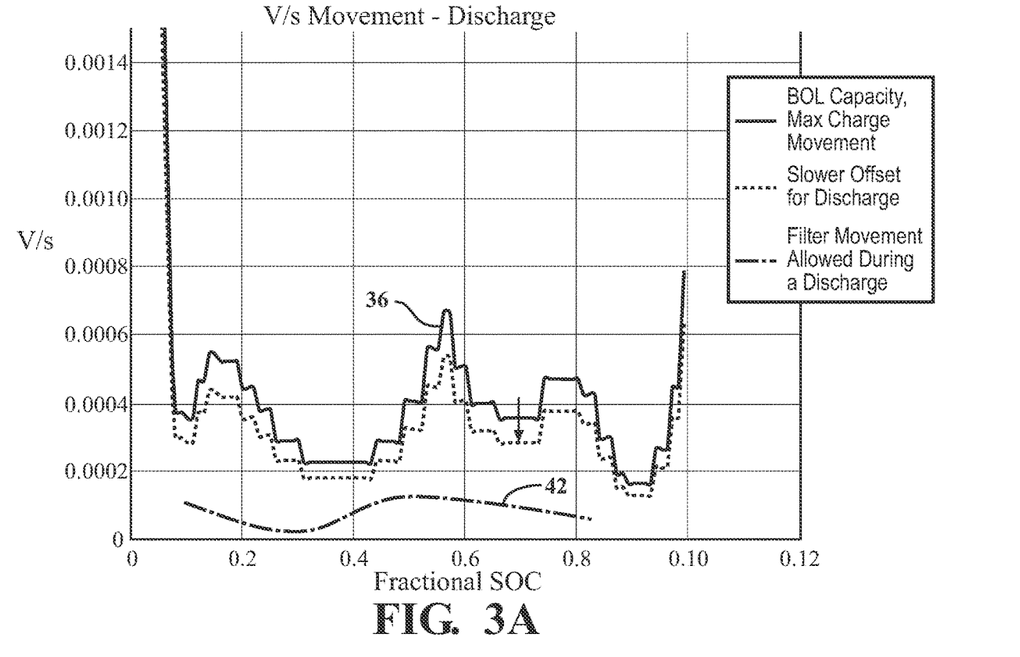
FIG. 3A is a graph depicting representative battery cell's open circuit voltage (OCV) movement over time versus the battery cell's state of charge (SOC), showing a predetermined offset advanced slower in discharge, and representative discharge overpredicted OCV movement across SOC allowed by a calibrated first-order lag filter, according to the disclosure.
Figure 3B:
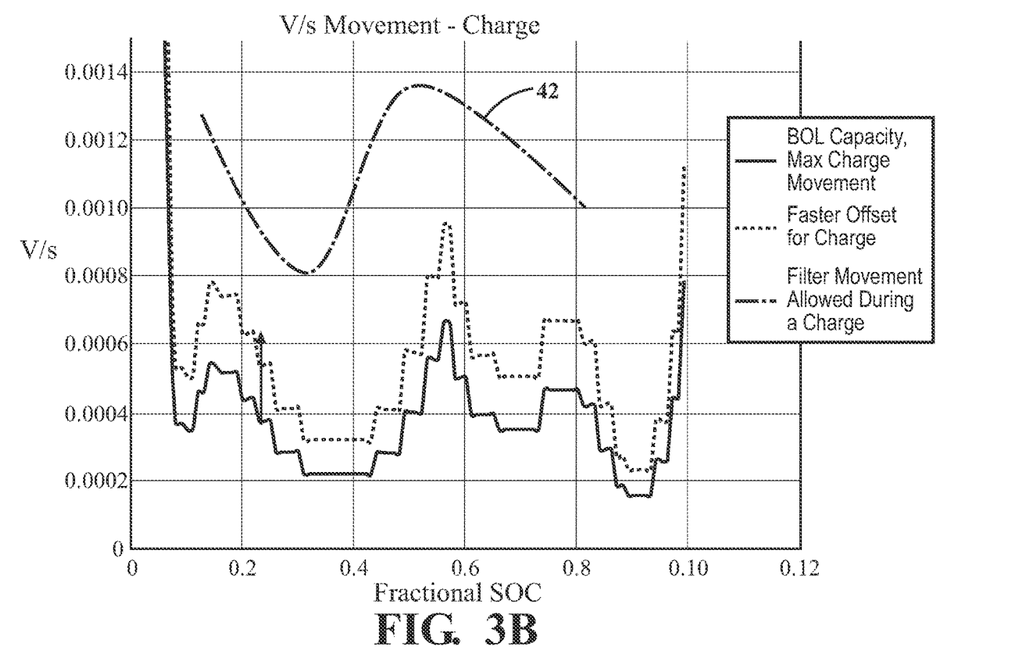
FIG. 3B is a graph depicting representative battery cell's OCV movement over time versus the battery cell's SOC, showing the predetermined offset advanced faster in charge, and representative charge overpredicted OCV movement across SOC allowed by the calibrated first-order lag filter, according to the disclosure.

The electronic controller 22 is programmed with a battery cell open circuit voltage (OCV) versus state of charge (SOC), represented as % of maximum value, data table 34. The OCV versus SOC data table 34 is used to calculate a peak OCV movement 36 in V/sec (shown in FIG. 3 depicting voltage movement versus the battery cell's SOC) for a representative battery cell at a predetermined, e.g., rated, cell capacity and maximum discharge or charge rate. The OCV versus SOC data table 34 may be compiled empirically, using one or more representative battery cells 26 to determine voltage change or movement over time shown in FIGS. 3A and 3B. The electronic controller 22 is configured to access the data table 34, along with one or more algorithms, to be described in detail below, during active cycling of the RESS 24, such as when the RESS supplies electrical energy to various vehicle systems and/or receives charging current.

Figure 4A:
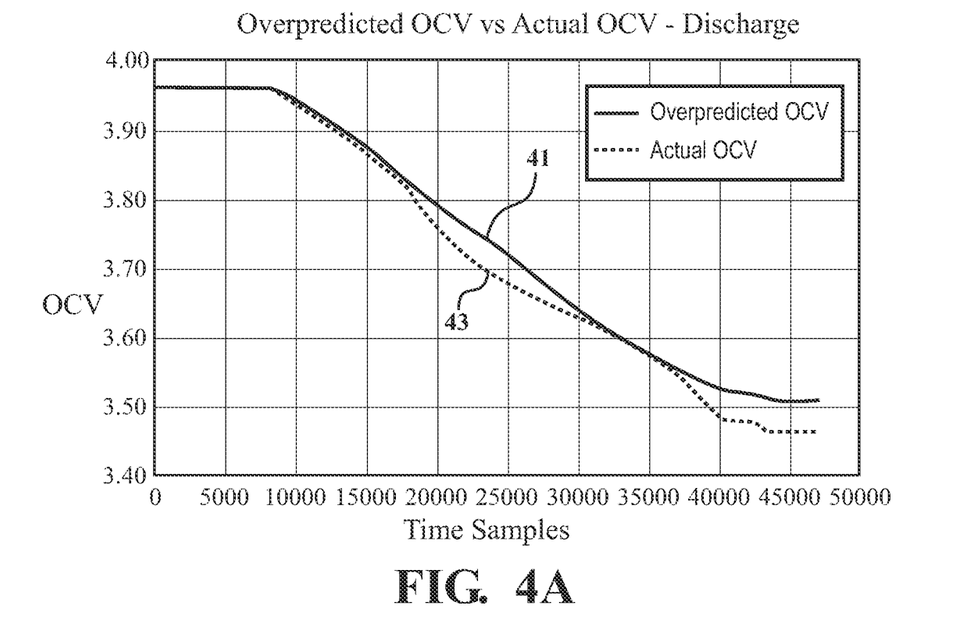
FIG. 4A is a graph depicting an exemplary discharge profile of overpredicted OCV from the output of the calibrated first-order lag filter versus actual/ideal OCV, according to the disclosure.

The electronic controller 22 is configured, i.e., programmed, to regulate operation of the RESS 24 by initially acquiring real-time voltage data, such as via voltage sensor(s) (not shown), for each of the battery cells 26 at multiple sample points during active cycling of the RESS. For exemplary purposes, operation of the electronic controller 22 will be described with respect to one of the battery cells 26, identified as a battery cell 26A (shown in FIG. 2). The electronic controller 22 is specifically configured to acquire real-time voltage data 38 for the battery cell 26A during active cycling of the RESS 24. The electronic controller 22 is configured to then pass the voltage data 38 acquired from the battery cell 26A through a first-order lag filter algorithm 40 programmed in the controller. Filtering the acquired voltage data 38 via the first-order lag filter algorithm 40 is intended to generate an overpredicted OCV 41 (shown in FIG. 4A) for the battery cell 26A through adjustment of allowed OCV movement 42 during battery usage (shown in FIG. 3A as filter movement allowed during a discharge and in FIG. 3B as filter movement allowed during a charge). Because voltage movement of a battery cell is impacted by temperature, the first-order lag filter algorithm 40 is calibrated as a function of battery cell 26A temperature to facilitate mapping of voltage movement across temperatures for more representative, smooth changes in allowed OCV movement 42 during battery usage over time.

Battery cell capacity will vary over time. Generally, reduced OCV movement for a battery cell occurs at maximum cell capacity. The capacity used in determination of the peak OCV movement 36 may be offset or reduced to overpredict present SOC. Accordingly, the allowed OCV movement 42 during battery usage is intended to overpredict actual battery cell OCV movement 43 (shown in FIG. 4A) using an assumption of higher battery cell capacity or slower current rate during discharge, or an assumption of lower battery cell capacity or faster current rate during charge. Assuming battery cell discharge or charge at maximum electrical current, the battery cell's SOC movement per second may be represented by the following expression:

$$\text{Amp-hours/sec}*(100\% \text{ SOC})/\text{Amp-hours}=(100\% \text{ SOC})/\text{sec}$$

Therefore, change in OCV for a given battery cell capacity may be calculated in 1% increments from the OCV versus SOC data table 34 (shown in FIG. 2). In light of the above, the first-order lag filter algorithm 40 may be calibrated to move maximum battery cell voltage, the output as the OCV movement 42, slower during discharge or faster during charge than the calculated change in OCV for the subject battery cell.

Figure 4B:
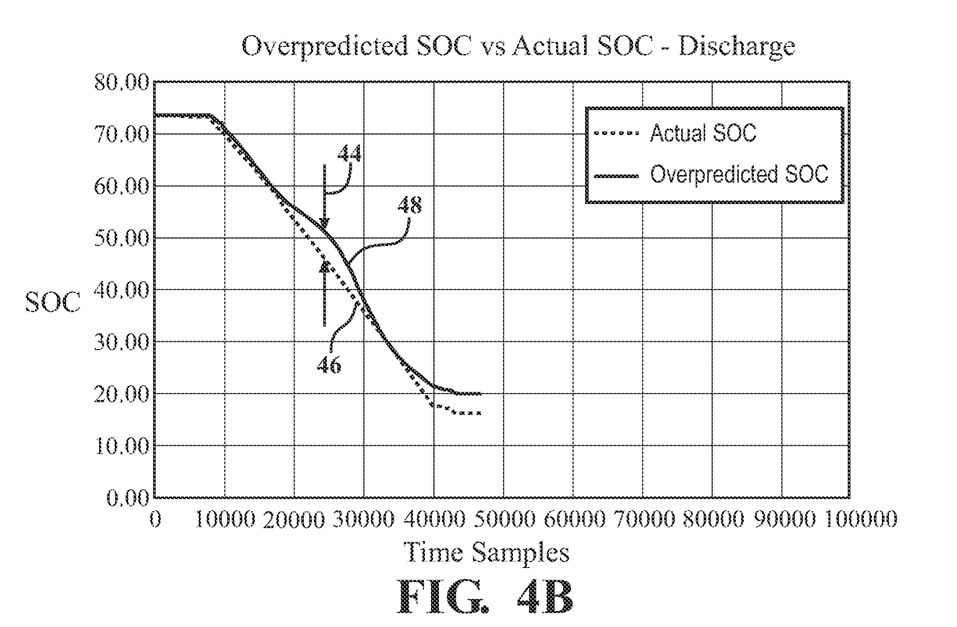
FIG. 4B is a graph depicting overpredicted SOC versus actual SOC obtained from an OCV versus SOC data table, according to the disclosure.

Specifically, the allowed OCV movement 42 is calibrated via selection of the filter algorithm 40 first filter gain coefficient 40A to advance slower in discharge and advance faster in charge than the calculated peak OCV movement 36 to overpredict the SOC by a predetermined margin 44. Specifically, the first filter gain coefficient 40A may be calibrated to generate the OCV for the battery cell 26A that is overpredicted within the predetermined SOC margin 44 versus actual or true SOC 46 (shown in FIG. 4B) for the battery cell 26A during active cycling of the RESS 24. The predetermined margin 44 may be defined as percentage (%) of difference of the overpredicted SOC in relation to the actual SOC. The predetermined margin 44 may be specifically calibrated to not exceed 5% overestimation relative to the actual SOC 46. The electronic controller 22 may be additionally configured to acquire temperature data 39 (shown in FIG. 2) for the battery cell 26A, such as via a temperature sensor (not shown). Furthermore, the first-order lag filter algorithm 40 may include a calibrated second filter gain coefficient 40B determined as a function of the acquired voltage and temperature data 38, 39 for the battery cell 26A. Accordingly, the calibrated second filter gain coefficient 40B may be specifically used to establish the predetermined margin 44.

The electronic controller 22 is also configured to use OCV values from the overpredicted OCV for the battery cell 26A to determine or look up corresponding overpredicted SOC values 48 (shown in FIG. 4B) in the OCV versus SOC data table 34. The overpredicted SOC values 48 exceed the actual SOC 46 (shown in FIG. 4B) for the battery cell 26A by the predetermined margin 44. In the case of overpredicted SOC value 48, the predetermined margin 44 would be in terms of percentage of the battery's actual SOC 46. The predetermined margin 44 may be specifically controlled to not exceed 5% relative to the actual SOC 46. The electronic controller 22 is additionally configured to regulate the RESS 24 using the determined overpredicted SOC value 48 for the battery cell 26A via operation of various vehicle 10 systems and accessories.

The electronic controller 22 may be particularly configured to control flow and/or temperature of a coolant 50 through the RESS 24, such as by circulating the coolant through a coolant plate 52 (shown in FIG. 2) arranged adjacent the battery cells 26. Controlling the flow and/or temperature of the coolant 50 is intended to remove thermal energy from the battery cell 26A when the overpredicted SOC value 48 is within the predetermined margin 44 or a preset lower limit value. In addition to the above, the electronic controller 22 may be configured to regulate the RESS 24 by removing thermal energy from the battery cell 26A by controlling a speed of a cooling fan 56 (shown in FIG. 2).

The electronic controller 22 may also be configured to regulate the RESS 24 via controlling a rate of charge and/or discharge of the plurality of battery cells 26. Specifically, the electronic controller 22 may regulate the rate of battery cell 26A discharge by limiting power output of the traction motor 14 or the rate of cell charge by limiting the amount of traction motor regenerative vehicle braking. Additionally, the electronic controller 22 may regulate the rate of battery cell 26A discharge by limiting charge current of an onboard charging station 58 or offboard charging station 60 (such as in a plug-in vehicle application) when the overpredicted SOC value 48 is within the predetermined margin 44.

Overall, the generation of the overpredicted OCV 41 via described filtering is intended to represent an overpredicted SOC that does not underestimate the true SOC of the battery cells 26. Thus, the overpredicted OCV 41 enables earlier derating of current draw in the RESS 24 and will target lower operating temperatures of the RESS 24. Such actions will mitigate the probability of the RESS 24 going into a thermal runaway event, where a thermal event starting within an individual cell may lead to the heat spreading uncontrollably to adjacent cells in the module and cause the thermal event to affect the entire battery array. Moreover, the remedial actions taken early based on the overpredicted OCV 41 may forestall a thermal event in a particular battery cell, which may otherwise be triggered by such conditions as a short circuit within the cell, improper cell use, physical abuse, manufacturing defects, or exposure of the cell to extreme external temperatures.

Figure 5:
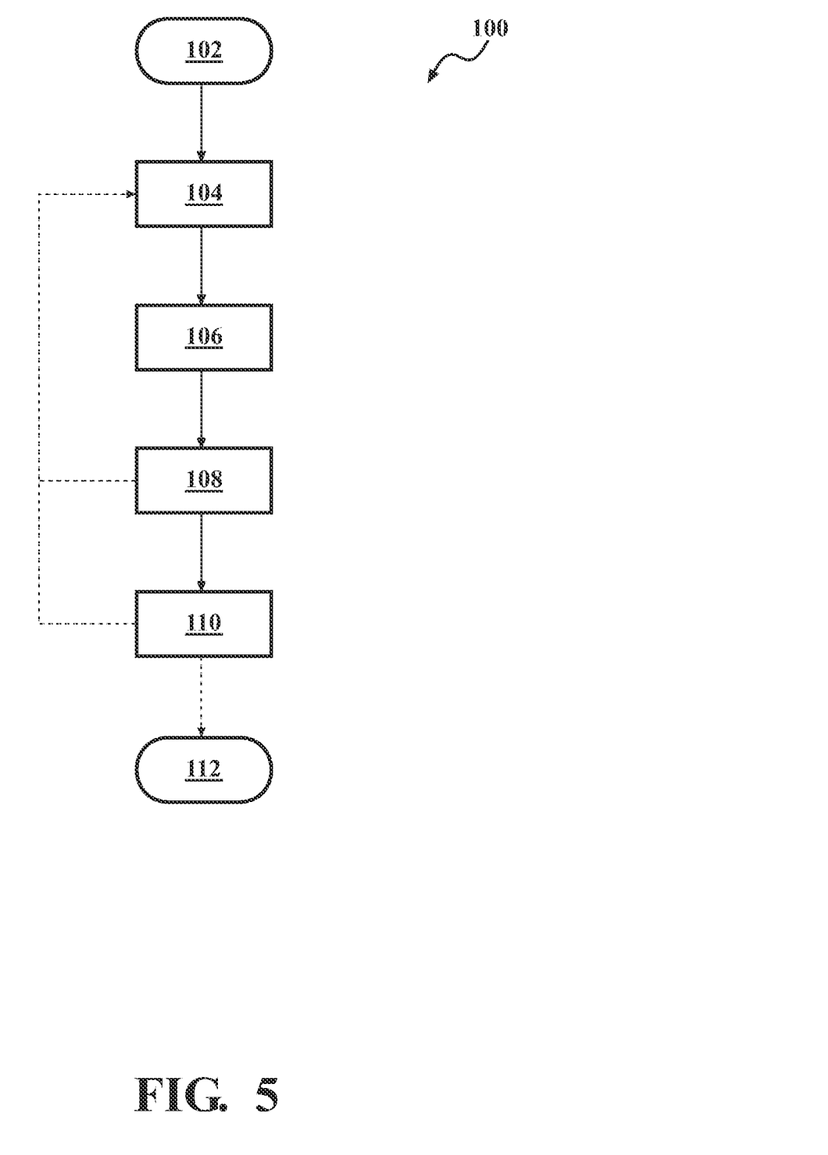
FIG. 5 illustrates a method of regulating a multi-cell rechargeable energy storage system (RESS) shown in FIGS. 1-2 and battery cell OCV versus SOC data processing described with respect to FIGS. 3-4.

A method 100 of regulating the RESS 24 is shown in FIG. 5 and described below with reference to the structure shown in FIGS. 1-4. Method 100 commences in frame 102 with monitoring operation of the RESS 24, and detecting a current inflow or current draw, such as in a vehicle 10 from various vehicle systems and accessories. After frame 102, the method proceeds to frame 104. In frame 104, the method includes acquiring, via the electronic controller 22, real-time voltage data 38 for each individual battery cell 26, such as the cell 26A, during active cycling of the RESS 24. As described above with respect to FIGS. 1-4, the electronic controller 22 is programmed with the battery cell OCV versus SOC data table 34, wherein the subject data table is used to calculate the peak OCV movement 36 for the battery cell 26A at the predetermined capacity and maximum discharge or charge rate. Following frame 104, the method advances to frame 106.

In frame 106, the method includes passing, via the electronic controller 22, the acquired voltage data 38 through the first-order lag filter algorithm 40. Thus, filtering the acquired voltage data 38 is intended to generate the overpredicted OCV 41 for the battery cell 26A, such that the overpredicted OCV is calibrated to advance slower in discharge and advance faster in charge than the actual OCV movement 43. Passing the acquired voltage data 38 through the first-order lag filter algorithm 40 includes calibrating the first filter gain coefficient 40A to generate the overpredicted OCV 41 for the battery cell 26A. In frame 106, the method may additionally include acquiring temperature data 39, via the electronic controller, for the battery cell 26A. The first-order lag filter algorithm 40 may include the calibrated second filter gain coefficient 40B determined as a function of the acquired voltage and temperature data 38, 39 for the battery cell 26A.

From frame 106, the method moves on to frame 108, where the method includes determining, via the electronic controller 22, the overpredicted SOC value 48 for the battery cell 26A in the OCV versus SOC data table 34 using the OCV value from the overpredicted OCV 41. As described above, the overpredicted SOC value 48 is intended to exceed the true SOC 46 for the battery cell 26A by the predetermined margin 44. Specifically, the predetermined margin 44 may be controlled to not exceed 5% relative to the true SOC 46. After frame 108, the method advances to frame 110.

In frame 110, the method includes regulating, via the electronic controller 22, the RESS 24 with remedial actions using the determined overpredicted SOC value 48 for the battery cell 26A. According to the method, regulating the RESS 24 may be accomplished via at least one of controlling flow and/or temperature of the coolant 50 through the RESS 24 to remove thermal energy from the battery cell 26A. Regulating the RESS 24 may also include controlling a speed of the cooling fan 56. Additionally, the method may include controlling a rate of charge and/or discharge of the battery cell 26A. As described above, controlling the rate of charge and/or discharge of the battery cell 26A may include limiting power output of the traction motor 14 or limiting charge current of the onboard charging station 58 or the offboard charging station 60. Each of the above listed actions may be accomplished in response to the overpredicted SOC value 48 being assessed within the predetermined margin 44.

Following either of the frames 108 or 110, the method may loop back to frame 104 for continued acquisition of voltage data 38 for battery cells 26, filtering of the acquired voltage data 38, and determining the overpredicted SOC value 48. The remedial actions using the overpredicted OCV 41 and eventually taken in frame 110 may permit operation of the RESS 24 to be regulated preemptively to avoid extreme battery cell temperatures and other concerns. Furthermore, the method may also be run on each cell group 28, module 30, subpack 32, and generally on the RESS 24 using scaled voltage for each. The method may repeat frames 104-110 for each battery cell 26, while the RESS 24 is active and until at least one of the battery cells 26 is assessed to be in need of replacement. Alternatively, the method may conclude in frame 112.

The detailed description and the drawings or figures are supportive and descriptive of the disclosure, but the scope of the disclosure is defined solely by the claims. While some of the best modes and other embodiments for carrying out the claimed disclosure have been described in detail, various alternative designs and embodiments exist for practicing the disclosure defined in the appended claims. Furthermore, the embodiments shown in the drawings or the characteristics of various embodiments mentioned in the present description are not necessarily to be understood as embodiments independent of each other. Rather, it is possible that each of the characteristics described in one of the examples of an embodiment may be combined with one or a plurality of other desired characteristics from other embodiments, resulting in other embodiments not described in words or by reference to the drawings. Accordingly, such other embodiments fall within the framework of the scope of the appended claims.

What is claimed is:

1. A battery system comprising:
 a multi-cell rechargeable energy storage system (RESS) having a plurality of battery cells; and
 an electronic controller connected to the RESS and configured to process data for the plurality of battery cells;
 wherein:
  the electronic controller is programmed with a battery cell open circuit voltage (OCV) versus state of charge (SOC) data table;
  the OCV versus SOC data table is used to calculate a peak OCV movement for a representative battery cell at predetermined capacity and maximum discharge or charge rate; and
  the electronic controller is configured to:
   acquire voltage data for one of the plurality of battery cells during active cycling of the RESS;
   pass the acquired voltage data through a first-order lag filter algorithm to generate an overpredicted OCV for the one of the plurality of battery cells, such that the overpredicted OCV is calibrated to advance slower in discharge and advance faster in charge than the calculated peak OCV movement by a predetermined margin;
   determine an overpredicted SOC value for the one of the plurality of battery cells in the OCV versus SOC data table using an OCV value from the overpredicted OCV, wherein that the overpredicted SOC value exceeds a true SOC for the one of the plurality of battery cells by the predetermined margin; and
   regulate the RESS using the determined overpredicted SOC value for the one of the plurality of battery cells.

2. The battery system of claim 1, wherein the predetermined margin is controlled to not exceed 5% error of the overpredicted SOC relative to the true SOC.

3. The battery system of claim 1, wherein the first-order lag filter algorithm includes a first filter gain coefficient calibrated to generate the overpredicted OCV for the one of the plurality of battery cells using the acquired voltage data for the one of the plurality of battery cells during active cycling of the RESS.

4. The battery system of claim 1, wherein the electronic controller is additionally configured to acquire temperature data for the one of the plurality of battery cells, the first-order lag filter algorithm includes a calibrated second filter gain coefficient determined as a function of the acquired temperature and voltage data for the one of the plurality of battery cells.

5. The battery system of claim 1, wherein the electronic controller is configured to regulate the RESS via controlling flow and/or temperature of a coolant through the RESS to remove thermal energy from the one of the plurality of battery cells when the overpredicted SOC value is with a predetermined margin.

6. The battery system of claim 1, wherein the electronic controller is configured to regulate the RESS via controlling a speed of a cooling fan to remove thermal energy from the one of the plurality of battery cells when the overpredicted SOC value is within a predetermined margin.

7. The battery system of claim 1, wherein the electronic controller is configured to regulate the RESS via controlling a rate of charge and/or discharge of the plurality of battery cells when the overpredicted SOC value is within a predetermined margin.

8. The battery system of claim 7, wherein controlling the rate of charge and/or discharge of the plurality of battery cells includes at least one of:
limiting power output of a traction motor operatively connected to the RESS; and
regulating a charge current of one of an onboard and an offboard charging station.

9. A method of regulating a multi-cell rechargeable energy storage system (RESS) having a plurality of battery cells, the method comprising:
acquiring, via an electronic controller, voltage data for one of the plurality of battery cells during active cycling of the RESS, wherein:
the electronic controller is programmed with a battery cell open circuit voltage (OCV) versus state of charge (SOC) data table; and
the OCV versus SOC data table is used to calculate a peak OCV movement for a representative battery cell at predetermined capacity and maximum discharge or charge rate;
passing, via the electronic controller, the acquired voltage data through a first-order lag filter algorithm to generate an overpredicted OCV for the one of the plurality of battery cells, such that the overpredicted OCV is calibrated to advance slower in discharge and advance faster in charge than the calculated peak OCV movement by a predetermined margin;
determining, via the electronic controller, an overpredicted SOC value for the one of the plurality of battery cells in the OCV versus SOC data table using an OCV value from the overpredicted OCV, wherein the overpredicted SOC value exceeds a true SOC for the one of the plurality of battery cells by the predetermined margin; and
regulating, via the electronic controller, the RESS using the determined overpredicted SOC value for the one of the plurality of battery cells.

10. The method of claim 9, wherein the predetermined margin is controlled to not exceed 5% error of the overpredicted SOC relative to the true SOC.

11. The method of claim 9, wherein passing the acquired voltage data through the first-order lag filter algorithm includes calibrating a first filter gain coefficient to generate the overpredicted OCV for the one of the plurality of battery cells using the acquired voltage data for the one of the plurality of battery cells during active cycling of the RESS.

12. The method of claim 9, further comprising acquiring temperature data, via the electronic controller, for the one of the plurality of battery cells, and wherein the first-order lag filter algorithm includes a calibrated second filter gain coefficient determined as a function of the acquired temperature and voltage data for the one of the plurality of battery cells.

13. The method of claim 9, wherein regulating the RESS is accomplished via at least one of controlling flow and/or temperature of a coolant through the RESS to remove thermal energy from the one of the plurality of battery cells, controlling a speed of a cooling fan to remove thermal energy from the one of the plurality of battery cells, and controlling a rate of charge and/or discharge of the plurality of battery cells when the overpredicted SOC value is within a predetermined margin.

14. The method of claim 13, wherein controlling the rate of charge and/or discharge of the plurality of battery cells includes at least one of:
limiting power output of a traction motor operatively connected to the RESS; and
regulating a charge current of one of an onboard and an offboard charging station.

15. A motor vehicle comprising:
a multi-cell rechargeable energy storage system (RESS) having a plurality of battery cells;
a traction motor operatively connected to the RESS; and
an electronic controller connected to each of the RESS and the traction motor and configured to process data for the plurality of battery cells;
wherein:
the electronic controller is programmed with a battery cell open circuit voltage (OCV) versus state of charge (SOC) data table;
the OCV versus SOC data table is used to calculate a peak OCV movement for a representative battery cell at predetermined capacity and maximum discharge or charge rate; and
the electronic controller is configured to:
acquire voltage data for one of the plurality of battery cells during active cycling of the RESS;
pass the acquired voltage data through a first-order lag filter algorithm to generate an overpredicted OCV for the one of the plurality of battery cells, such that the overpredicted OCV is calibrated to advance slower in discharge and advance faster in charge than the calculated peak OCV movement by a predetermined margin;
determine an overpredicted SOC value for the one of the plurality of battery cells in the OCV versus SOC data table using an OCV value from the overpredicted OCV, wherein the overpredicted SOC value exceeds a true SOC for the one of the plurality of battery cells by the predetermined margin; and
regulate the RESS using the determined overpredicted SOC value for the one of the plurality of battery cells.

16. The motor vehicle of claim 15, wherein the predetermined margin is controlled to not exceed 5% error of the overpredicted SOC relative to the true SOC.

17. The motor vehicle of claim 15, wherein the first-order lag filter algorithm includes a first filter gain coefficient calibrated to generate the overpredicted OCV for the one of the plurality of battery cells, which tracks, within the predetermined margin, the acquired voltage data for the one of the plurality of battery cells during active cycling of the RESS.

18. The motor vehicle of claim 15, wherein the electronic controller is additionally configured to acquire temperature data for the one of the plurality of battery cells, the first-order lag filter algorithm includes a calibrated second filter gain coefficient determined as a function of the acquired temperature and voltage data for the one of the plurality of battery cells.

19. The motor vehicle of claim 15, wherein the electronic controller is configured to regulate the RESS via at least one of controlling flow and/or temperature of a coolant through the RESS to remove thermal energy from the one of the plurality of battery cells, controlling a speed of a cooling fan to remove thermal energy from the one of the plurality of battery cells, and controlling a rate of charge and/or discharge of the plurality of battery cells when the overpredicted SOC value is within a predetermined margin.

20. The motor vehicle of claim 19, wherein controlling the rate of charge and/or discharge of the plurality of battery cells includes at least one of:
   limiting power output of a traction motor operatively connected to the RESS; and
   regulating a charge current of one of an onboard and an offboard charging station.

\* \* \* \* \*